United States Patent
Kim et al.

(10) Patent No.: US 8,767,203 B2
(45) Date of Patent: Jul. 1, 2014

(54) PLASMA MONITORING DEVICE USING A CYLINDRICAL HOLLOW ELECTRODE

(75) Inventors: Se-Yeon Kim, Hwaseong-si (KR); Hun Jung Yi, Suwon-si (KR); Sangpyoung Jeon, Suwon-si (KR); Hyojin Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 13/217,699

(22) Filed: Aug. 25, 2011

(65) Prior Publication Data
US 2012/0062887 A1 Mar. 15, 2012

(30) Foreign Application Priority Data
Sep. 10, 2010 (KR) .................. 10-2010-0089047

(51) Int. Cl.
  *G01J 3/30* (2006.01)
(52) U.S. Cl.
  USPC ........................................................ 356/316
(58) Field of Classification Search
  USPC ................ 356/316, 121.48, 231.41, 72, 311; 313/231.41; 219/121.48
  See application file for complete search history.

(56) References Cited

U.S. PATENT DOCUMENTS

| | | | | |
|---|---|---|---|---|
| 5,076,223 A | * | 12/1991 | Harden et al. | 123/143 B |
| 5,591,356 A | * | 1/1997 | Sakuragi et al. | 219/121.5 |
| 5,986,747 A | * | 11/1999 | Moran | 356/72 |
| 6,864,982 B2 | | 3/2005 | Hanazaki et al. | |
| 7,679,025 B1 | * | 3/2010 | Krishnan et al. | 219/121.48 |
| 2009/0125094 A1 | * | 5/2009 | Rust | 623/1.12 |
| 2011/0026657 A1 | * | 2/2011 | Laberge et al. | 376/133 |
| 2011/0243292 A1 | * | 10/2011 | Howard et al. | 376/133 |

FOREIGN PATENT DOCUMENTS

| | | |
|---|---|---|
| JP | 08-0106992 | 4/1996 |
| KR | 1020080086063 | 9/2008 |
| KR | 1020080101968 | 11/2008 |

* cited by examiner

*Primary Examiner* — Tarfur Chowdhury
*Assistant Examiner* — Michael P Lapage
(74) *Attorney, Agent, or Firm* — Myers Bigel Sibley & Sajovec, P.A.

(57) ABSTRACT

A plasma generating unit for a process monitoring device includes a hollow first electrode extending in a length direction and a second electrode extending in the length direction and positioned within and displaced from the first electrode with a distance therebetween. The first electrode has an inner diameter and the second electrode has an outer diameter selected to vary the distance between the electrodes in the length direction so that the plasma generating unit generates a plasma by ionizing a gas flowing between the electrodes at a different position in the length direction based on a pressure of the gas.

7 Claims, 12 Drawing Sheets

PLASMA MONITORING DEVICE USING A CYLINDRICAL HOLLOW ELECTRODE

CROSS-REFERENCE TO RELATED APPLICATIONS

This US non-provisional patent application claims priority under 35 USC §119 to Korean Patent Application No. 10-2010-0089047, filed on Sep. 10, 2010, the entirety of which is hereby incorporated by reference.

BACKGROUND OF THE INVENTION

The inventive concept described herein relates to a process monitoring device for monitoring a semiconductor device manufacturing process, a semiconductor process apparatus including the same, and a process monitoring method using the same.

Semiconductor devices are generally manufactured using a fabrication (FAB) process, an electrical die sorting (EDS) process, and a package assembly process. In the FAB process, chemical vapor deposition (CVD), physical vapor deposition (PVD), thermal oxidation, ion implantation, ion diffusion and the like may be performed to form various layers on a substrate. These layers may be etched to form patterns having electrical characteristics.

In the FAB process, a device for monitoring a gas exhausted from a process chamber is typically used to monitor whether a process is performed as expected or whether the process chamber leaks and to determine an endpoint of the process.

SUMMARY OF THE INVENTION

Some embodiments provide a plasma generating unit for a process monitoring device including a hollow first electrode extending in a length direction and a second electrode extending in the length direction and positioned within and displaced from the first electrode with a distance therebetween. The first electrode has an inner diameter and the second electrode has an outer diameter selected to vary the distance between the electrodes in the length direction so that the plasma generating unit generates a plasma by ionizing a gas flowing between the electrodes at a different position in the length direction based on a pressure of the gas. The electrodes may each extend around substantially an entire circumference of the electrodes and the plasma generating unit may be configured to generate the plasma to have a donut-shaped three-dimensional space distribution.

In other embodiments, the first and second electrode are coaxially aligned in the length direction and the distance between the electrodes is substantially the same around the entire circumference of the electrodes. The inner diameter of the first electrode may vary substantially uniformly in the length direction. The outer diameter of the second electrode may be substantially unchanged in the length direction.

In further embodiments, the outer diameter of the second electrode varies substantially uniformly in the length direction and decreases as the inner diameter of the first electrode increases. The outer diameter of the second electrode may vary substantially uniformly in the length direction and the inner diameter of the first electrode may be substantially unchanged in the length direction.

In other embodiments, the inner diameter of the first electrode is stepped in the length direction. The inner diameter of the second electrode may be stepped in the length direction and decrease as the inner diameter of the first electrode increases.

In further embodiments, a process monitoring device includes the plasma generating unit of Claim 1 and also includes an optical emission spectroscopy unit and a power supply. The optical emission spectroscopy unit is positioned proximate the plasma generating unit and is configured to analyze light emitted from the plasma generated by the plasma unit. The power supply is coupled to the first and second electrodes configured to power the electrodes to ionize the gas flowing therebetween.

In yet other embodiments, a process monitoring device includes a plasma generating unit and an optical emission spectroscopy unit positioned proximate the plasma generating unit that is configured to analyze light emitted from the plasma generated by the plasma unit. A power supply is coupled to the first and second electrodes that is configured to power the electrodes to ionize the gas flowing therebetween. The plasma generating unit includes a hollow cylindrical first electrode having a length extending in a length direction and a second electrode having a length extending in the length direction and positioned within and displaced from the first electrode. The length of the second electrode is the same as the length of the first electrode. The power supply may be configured to supply an alternating voltage to one of the electrodes and to ground the other of the electrodes.

In further embodiments, the first electrode has an inner diameter and the second electrode has an outer diameter selected to vary a distance between the electrodes in a length direction so that the plasma generating unit generates a plasma by ionizing a gas flowing between the electrodes at a different position in the length direction based on a pressure of the gas. The electrodes may have a distance therebetween around substantially an entire circumference of the electrodes and the plasma generating unit may be configured to generate the plasma to have a donut-shaped three-dimensional space distribution. The first and second electrode may be coaxially aligned in the length direction and a distance between the electrodes may be substantially the same around the entire circumference of the electrodes.

In other embodiments, the process monitoring device further includes a housing including an inflow port configured to be coupled to an exhaust line of a process chamber of a semiconductor manufacturing process. A partition divides the housing into a first area, with the inflow port positioned on a first side of the first area and a window in the partition opposite the inflow port, and a second area. The plasma generating unit is positioned in the first area extending in the length direction from proximate the inflow port to proximate the window and the optical spectroscopy unit is positioned in the second area to detect the light emitted from the plasma.

In yet further embodiments, a semiconductor process apparatus includes a process monitoring device as described above and further includes the process chamber configured to execute a semiconductor manufacturing process and having the exhaust line extending therefrom.

In other embodiments, a semiconductor process apparatus includes a process chamber configured to execute a semiconductor manufacturing process and having an exhaust line extending therefrom. A housing includes an inflow port connected to the exhaust line of the process chamber and a partition dividing an inner space thereof into a first area and a second area. The partition includes a window therein between the first and second area. A plasma unit is positioned in first area of the housing and configured to generate plasma by ionizing an exhaust gas flowing from the process chamber into the housing through the inflow port. An optical emission spectroscopy unit is positioned in the second area of the housing and configured to analyzing light emitted from the plasma. The plasma unit includes an open ended hollow cylindrical first electrode extending in a length direction from proximate the inflow port to proximate the window in the partition and a second electrode positioned within and displaced from the first electrode with a distance therebetween and extending in the length direction from proximate the inflow port to proximate the window in the partition. The first electrode has an inner diameter and the second electrode has an outer diameter selected to vary the distance between the electrodes in the length direction so that the plasma generating unit generates a plasma by ionizing the exhaust gas flowing between the electrodes at a different position in the length direction based on a pressure of the exhaust gas. A power supply is coupled to the first and second electrodes that is configured to power the electrodes to ionize the gas flowing therebetween.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

Figure 1:
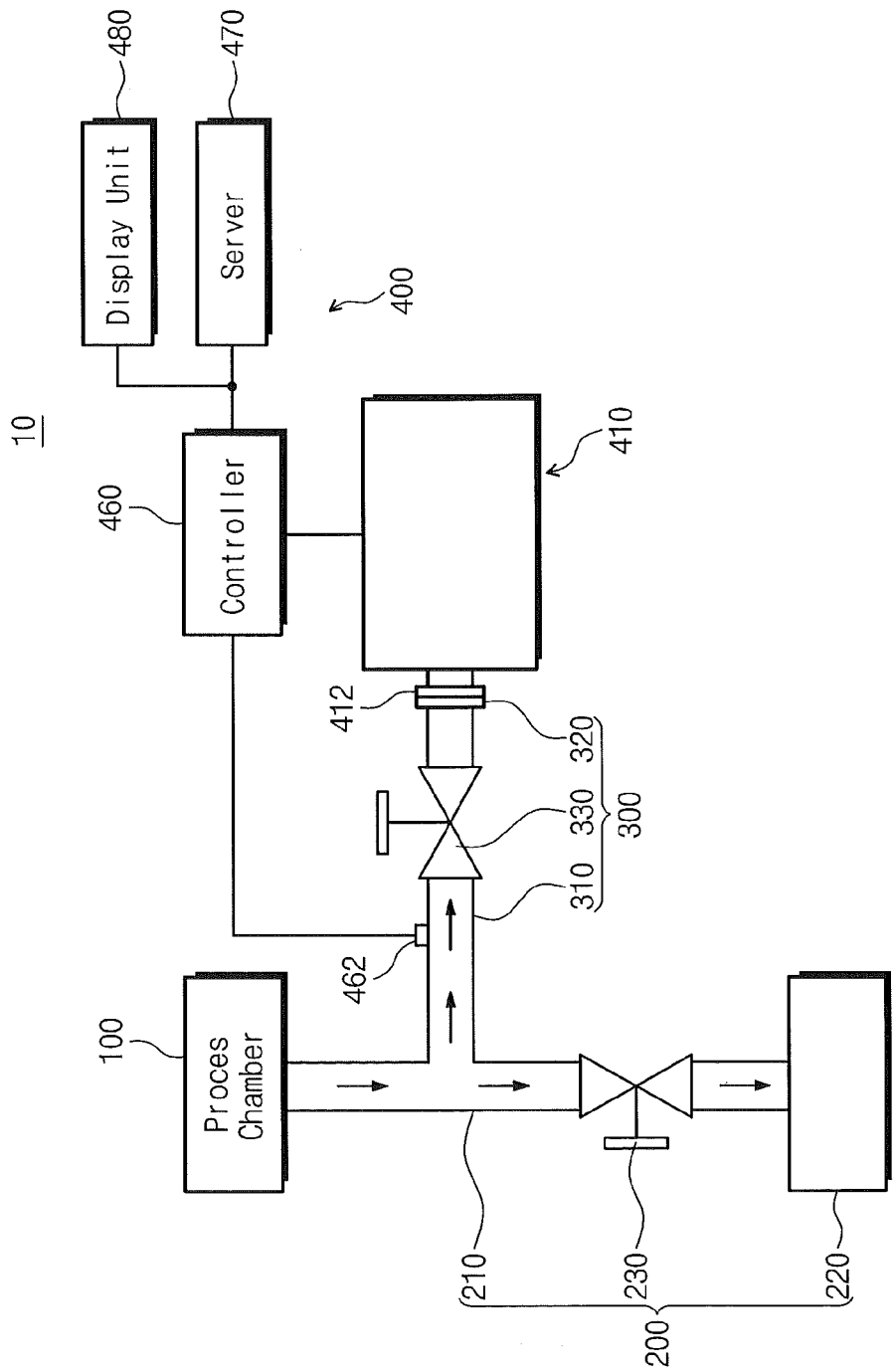
FIG. 1 illustrates a semiconductor process apparatus according to an embodiment of the inventive concept.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

For brevity of descriptions, several embodiments to which the inventive concepts are applicable will be illustratively described, and descriptions of various modified embodiments will be omitted herein. However, those skilled in the art may apply the inventive concepts to various cases based on the above-described descriptions and the illustrated embodiments.

FIG. 1 illustrates a semiconductor process apparatus 10 according to some embodiments. As illustrated, the semiconductor process apparatus 10 includes a process chamber 100, an exhaust part 200, a sampling part 300, and a process monitoring device 400.

The process chamber 100 is configured to perform a substrate treatment process. The substrate treatment process may be one of various semiconductor processes, such as a deposition process, an etching process, an ion implantation process, an ashing process, and/or a cleaning process. Each of theses processes may be performed in a low vacuum/high vacuum ambient or an atmospheric ambient. The exhaust part 200 is configured to exhaust a non-reactive gas or process byproducts from the process chamber 100. The sampling part 300 is configured to sample a part of an exhaust gas emitted through the exhaust part 200. The monitoring device 400 may be a self-plasma optical emission spectroscopy (SPOES,) that is configured to generate plasma from the exhaust gas sampled by the sampling part 300 and monitor the substrate treatment process performed in the process chamber 100 by analyzing a spectrum of light emitted from the plasma.

In a semiconductor process, gases for chemical reaction are used according to related processes. In a plasma state, the gases emit light of its own wavelength band component. Based on this principle, the process monitoring device (SPOES) 400 may sample the exhaust gas from the process chamber 100 to discharge the plasma, absorb waves emitted from the plasma in visible and ultraviolet light regions ranging from tens of nanometers to hundreds of nanometers, measure an intensity at each wavelength to analyze the kind and amount of elements constituting the plasma, and monitor the semiconductor treatment process performed in the process chamber 100 according to a result of the analysis.

The exhaust part 200 includes an exhaust line 210 connected to an exhaust port of the process chamber 100 and a pump 220 connected to the exhaust line 210. The pump 220 applies a negative pressure to the process chamber 100 through the exhaust line 210. Due to the negative pressure applied by the pump 220, the interior of the process chamber 100 may be maintained at a predetermined process pressure and non-reactive gas and reactive byproducts in the process chamber 100 may be exhausted. A valve 230 is mounted on the exhaust line 210 to open and close the flow of gas in the exhaust line 210. A purification device may be provided at the back end of the pump 220 to clean noxious substances from the exhaust gas.

The sampling part 300 is configured to sample a part of the exhaust gas emitted from the process chamber 100 through the exhaust part 200. The sampling part 300 includes a sampling line 310 and a connection port 320 coupled with the end of the sampling line 310. A part of the gas exhausted through the exhaust line 210 may flow into the sampling line 310 due to, for example, diffusion. A valve 330 is mounted on the sampling line 310 to open and close the flow of the sample gas flowing into the sampling line 310. A processing monitoring device 400 is coupled with the connection port 320.

The process monitoring device 400 generates plasma from the sample gas and analyzes the component and concentration of the sample gas through spectrum analysis of the light emitted from the plasma. The process monitoring device 400 includes a body 410, a controller 460, a server 470, and a display unit 480.

The body 410 is provided with an inflow port 412 into which the sample gas flows. The inflow port 412 is coupled with the connection port 320 of the sampling part 300. The body 410 is provided with a plasma unit for ionizing sample gas to generate plasma and an optical emission spectroscopy unit for receiving light emitted from the generated plasma to generate a signal on an optical spectrum.

The controller 460 may analyze the component and concentration of the sample gas in real time, based on the signal received from the optical emission spectroscopy unit, and compare analyzed data with a reference value to monitor whether a process performed in the process chamber 100 is normal or whether, for example, the process chamber 100 leaks. In addition, the controller 460 may analyze a time-based change of the received signal to determine an endpoint of the process. That is, if the intensity of an optical spectrum signal on gas used in the process is maintained high and the intensity of a spectrum signal on byproducts is maintained low, it may be understood that the process gas is not consumed any longer and byproducts are not produced. Thus, the controller 460 may determine that the process is completed.

The server 470 stores analysis data after receiving the analysis data from the controller 460. The display unit 480 displays the process monitoring result analyzed in the controller 460 or the process endpoint such that an operator may recognize the displayed result or endpoint.

In the embodiments described above, it has been described that the process monitoring device 400 is connected to the sampling line 310 branching from the exhaust line 210. However, the process monitoring device may be, for example, directly connected to the exhaust line 210 or the process chamber 100. In the case that the process monitoring device 400 is connected to the exhaust line 210, it may be installed adjacent to the process chamber 100 to eliminate an external interference.

Figure 2:
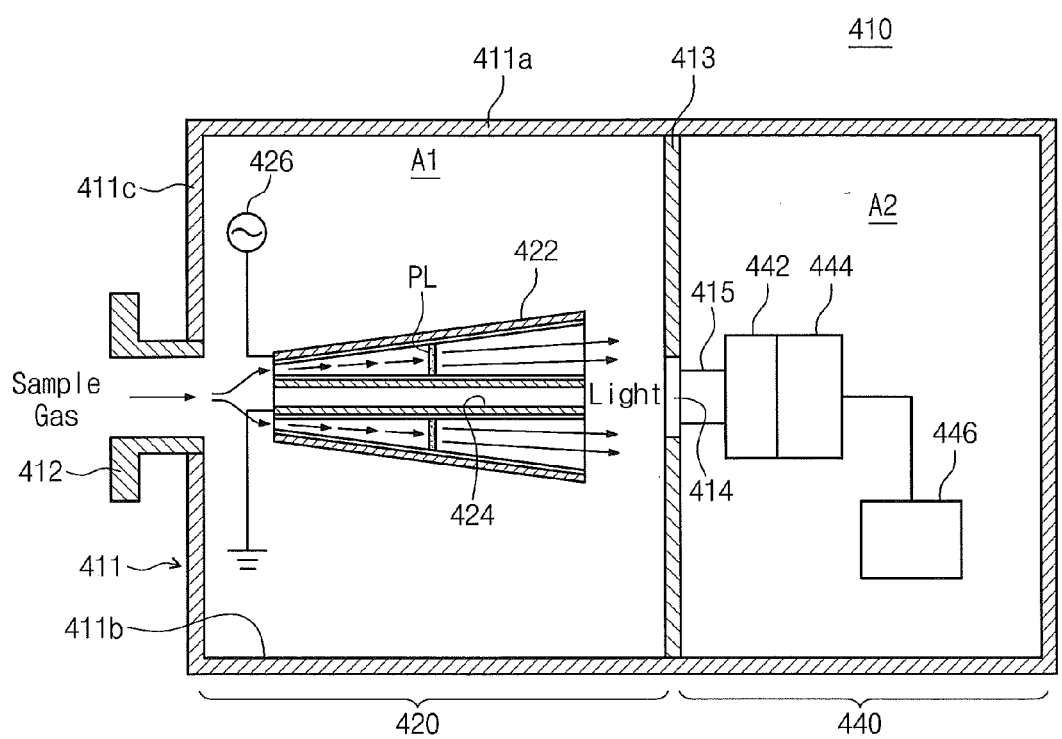
FIG. 2 illustrates a body of a process monitoring device according to an embodiment of the inventive concept.

FIG. 2 illustrates embodiments of the body 410 of the process monitoring device 400 of FIG. 1. As illustrated, the body 410 includes a housing 411, a plasma unit 420, and an optical emission spectroscopy unit 440.

The housing 411 includes an upper wall 411a and a lower wall 411b vertically spaced to face each other and sidewalls 411c extending from the edge circumference of the upper wall 411a to the edge circumference of the lower wall 411b. A sample gas flows into an inflow port 412 that is combined with an opening in the sidewall 411c. A partition 413 is provided inside the housing 411 that divides the inner space of the housing 411 into a first area A1 and a second area A2.

The first area A1 fluidically communicates with the inflow port 412 and is provided with the plasma unit 420. The second area A2 is disposed to be opposite to the first area A1 with the partition 413 therebetween and is provided with the optical emission spectroscopy unit 440.

The plasma unit 420 ionizes the sample gas flowing into the first area A1 through the inflow port 412 to generate plasma PL. The plasma unit 420 generates plasma, for example, by using dielectric barrier discharge (DBD) type electrodes 422 and 424. The first electrode 422 is connected to a power supply 426 configured to supply an alternating voltage, and the second electrode 424 is grounded. That is, the first electrode 422 is used as power electrode and the second electrode 424 is used as a ground electrode. When a sample gas flows into a space between the first electrode 422 and the second electrode 424 through the inflow port 412 and the power supply 426 applies an alternating voltage to the first electrode 422, the sample gas is ionized at a specific position of the space between the first electrode 422 and the second electrode 424, i.e., a plasma-generatable position corresponding to a pressure of the sample gas to generate plasma PL. Shape and arrangement structure of the electrodes 422 and 424 and plasma generation resulting therefrom will be described in detail later.

Light is emitted from the plasma PL generated by the plasma unit 420. The emitted light passes through a window 414 provided in the partition 413. The window 414 may be made of a quartz material and provided at a position facing the inflow port 412. The emitted light penetrating the window 414 is transmitted to the optical emission spectroscopy unit 440 through an optical cable 415. The optical emission spectroscopy unit 440 generates a signal corresponding to a spectrum of the emitted light.

The optical emission spectroscopy unit 440 includes a spectrometer 442, a detector 444, and a signal converter 446. The spectrometer 442 receives the emitted light through the optical cable 415 and spectrally divides the emitted light depending on each spectrum of a corresponding wavelength. The detector 444 may employ a CCD array and generate an analog signal for a spectrum from the light. The analog signal has a signal intensity that is variable with the kind and concentration of a sample gas. The signal converter 446, i.e., analog-digital converter (A/D converter), converts the analog signal to a digital signal for the spectrum of the light. The digital signal is transmitted to a controller (460 in FIG. 1). The controller 460 analyzes component and concentration of the sample gas, based on the received signal, to monitor whether a process is normally performed and/or determine an endpoint of the process.

Figure 3:
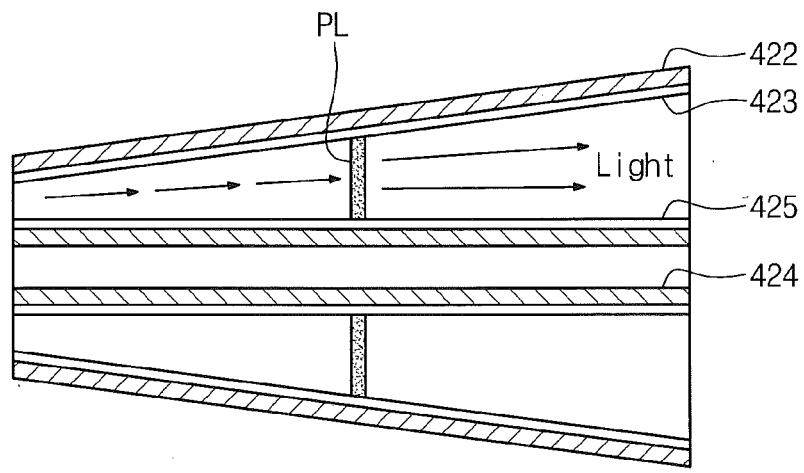
FIG. 3 is an enlarged view of a plasma unit shown in FIG. 2.
Figure 4:
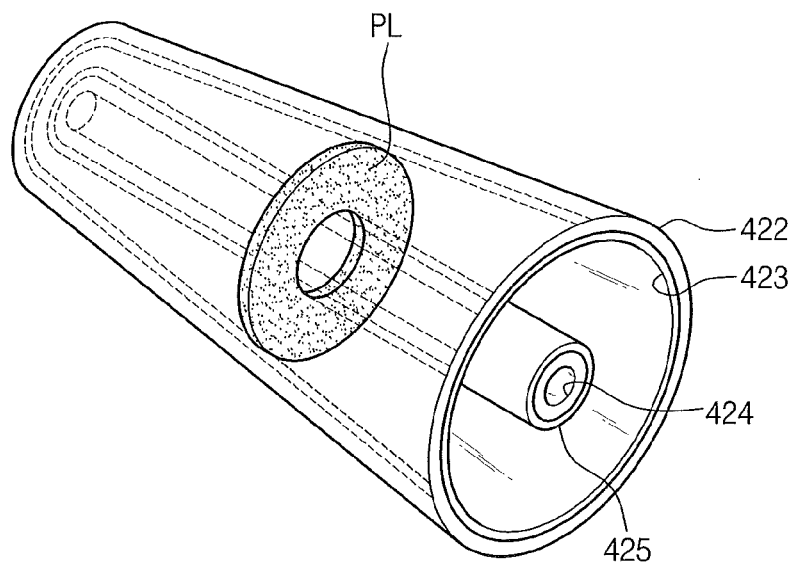
FIG. 4 is a perspective view of the plasma unit shown in FIG. 3.

FIG. 3 is an enlarged view of the plasma unit 420 shown in FIG. 2, and FIG. 4 is a perspective view of the plasma unit 420 shown in FIG. 3. Referring to FIGS. 2 to 4, the first and second electrodes 422 and 424 of the plasma unit 420 are disposed at a space between the inflow port 412 and the window 414 in the first area A1. Hereinafter, a direction toward the window 414 from the inflow port 412 will be referred to as a sample gas flow direction.

The first electrode 422 has a shape of a cylinder whose opposite ends are open and is disposed such that its length (axial) direction coincides with the sample gas flow direction. The cylinder tapers out in the sample gas flow direction to have a larger diameter at the end proximate the window 414 than at the end proximate the inflow port 412. The second electrode 424 has a shape of a hollow or solid rod (shown as hollow in FIGS. 2-4) and is inserted into a hollow portion inside the first electrode 422 such that its length direction coincides with the length direction of the first electrode 422.

The second electrode 424 may be coaxially arranged with the first electrode 422. That is, the second electrode 424 may be inserted into the first electrode 422 to have the same lengthwise central axis as that of the first electrode 422. A hollow axial space is formed between the first electrode 422 and the second electrode 424, and a sample gas flows into the hollow axial space.

Figure 5:
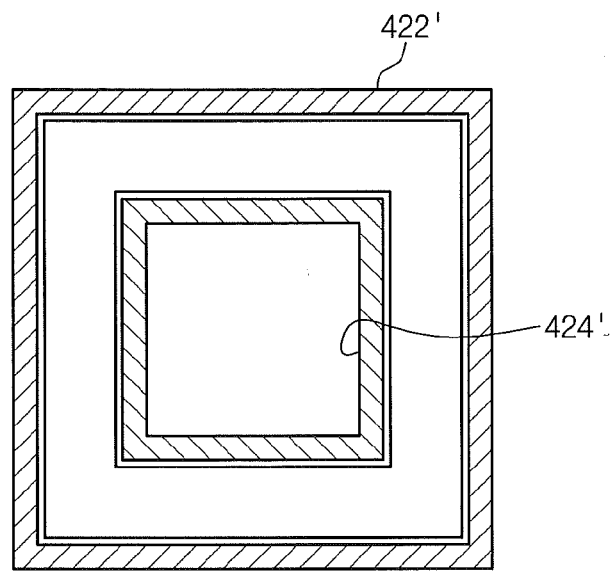
FIGS. 5 and 6 illustrate other examples of cross sections of first and second electrodes, respectively.
Figure 6:
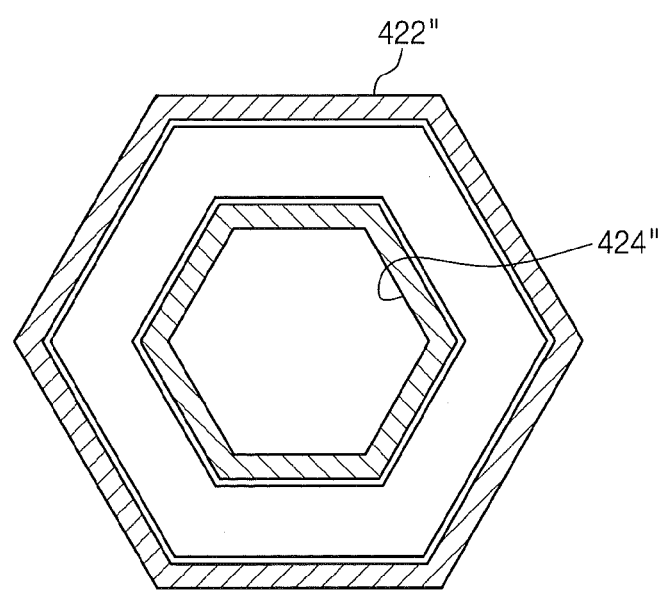

As noted above, the first electrode 422 may have a shape of cylinder with an inwardly hollow portion whose sectional area gradually increases in its length direction (the sample gas flow direction), i.e., a shape of cylinder with a tapered hollow portion. The second electrode 424 may have a shape of rod whose sectional area is constant. Thus, a distance between the first electrode 422 and the second electrode 424 is constant in a circumferential direction but gradually increases in the sample gas flow direction. A section of the hollow portion of the first electrode 422 and a section of the second electrode 424 may each be a circular section. In some embodiments, they may each be a polygonal section such as a tetragonal section or a hexagonal section, as shown in FIGS. 5 and 6. In FIGS. 5 and 6, reference numerals 422' and 422" each denote a first electrode and reference numerals 424' and 424" each denote a second electrode.

The power supply 426 is connected to the first electrode 422 to apply an alternating voltage, and the second electrode 424 is grounded in the illustrated embodiments of FIG. 2. That is, the first electrode 422 may be used as a power electrode and the second electrode 424 may be used as a ground electrode. Cooling lines may be provided inside the first electrode 422 and the second electrode 424, respectively. A refrigerant may flow along the cooling line. Dielectric substances 423 and 425 are provided on opposite surfaces of the first electrode 422 and the second electrode 424, respectively. A ceramic material may be used as the dielectric substances 423 and 425. For example, a dielectric substance may be ceramic such as silicon dioxide, aluminum oxide, zirconium dioxide, titan dioxide, and yttrium oxide.

From a low-pressure ambient to a high-pressure ambient, various ambients may exit in a process chamber (100 in FIG. 1) according to the kind of a process performed therein. Therefore, a pressure of a sample gas may have various values.

When the sample gas flows into a space between the first electrode 422 and the second electrode 424 through the inflow port 412 and the power supply 426 applies an alternating voltage to the first electrode 422, the sample gas is ionized at the space therebetween to generate plasma PL. A generation position of the plasma PL varies with the pressure of the sample gas. That is, the plasma PL is generated at a specific position (axial/length) where the distance between the electrodes 422 and 424 is maintained such that the plasma PL may be generated with respect to a sample gas of a specific pressure. As the distance between the first electrode 422 and the second electrode 424 at a specific axial position is constant in a circumferential direction, the generated plasma PL may have a donut-shaped three-dimensional space distribution between the first electrode 422 and the second electrode 424.

In a conventional process monitoring device, plate-type first and second electrodes are generally disposed to be inclined to each other to cope with pressure variability of a sample gas. For this reason, a plasma generation space between the electrodes is considerably narrow. As the narrower space makes density of plasma low, the intensity of light emitted from the low-density plasma is reduced, which may deteriorate reliability of process monitoring.

However, as described above, a process monitoring device according to some embodiments may generate plasma having a donut-shaped three-dimensional space distribution between the first electrode 422 and the second electrode 424. Thus, a plasma generation space is made wider than in a conventional process monitoring device. As a result, high-density plasma may be generated and the intensity of light emitted from plasma may increase, which may enhance reliability of process monitoring.

Figure 7A:
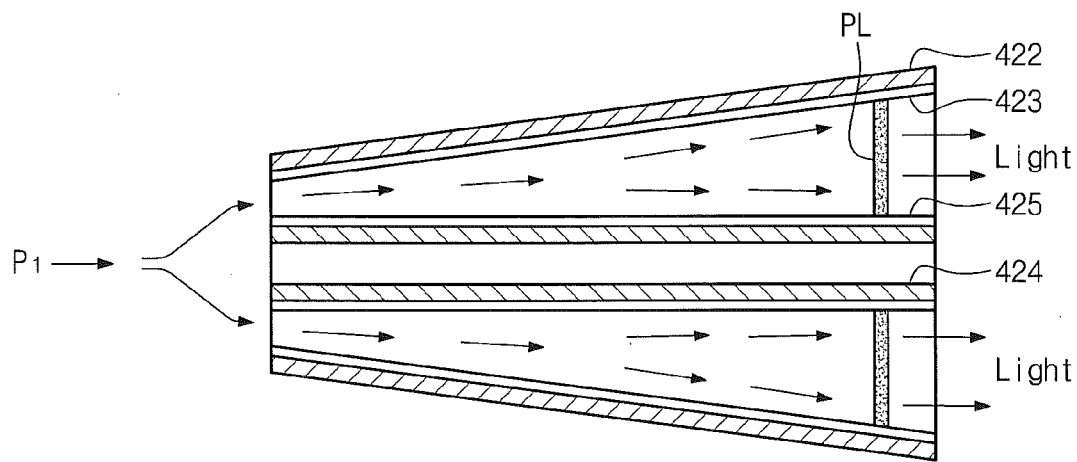
FIGS. 7A and 7B are cross sectional views that illustrate the operation of the plasma unit shown in FIG. 3.
Figure 7B:
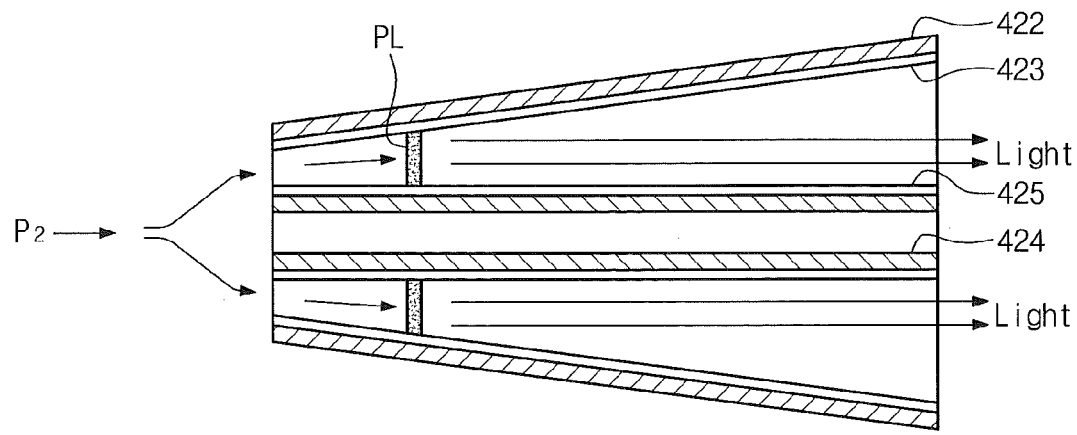

In the case that a pressure of a sample gas is a low pressure $P_1$ of high-vacuum, the space between the electrodes 422 and 424 must be wide to generate plasma PL, as shown in FIG. 7A. Therefore, the plasma PL is generated at a back (proximate the window 414) end portion of the space between the electrodes 422 and 424. Meanwhile, in the case that the pressure of a sample gas is an atmospheric pressure $P_2$, the space between the electrodes 422 and 424 must be narrower, as shown in FIG. 7B. Therefore, the plasma PL is generated at a front end portion of the space between the electrodes 422 and 424. As plasma is generated in such a manner while a plasma generation position varies with a pressure of a sample gas, the process monitoring device 400 may effectively monitor a process irrespective of the pressure of a sample gas.

Now, the operation of a plasma unit according to further embodiments will be described below.

Figure 8A:
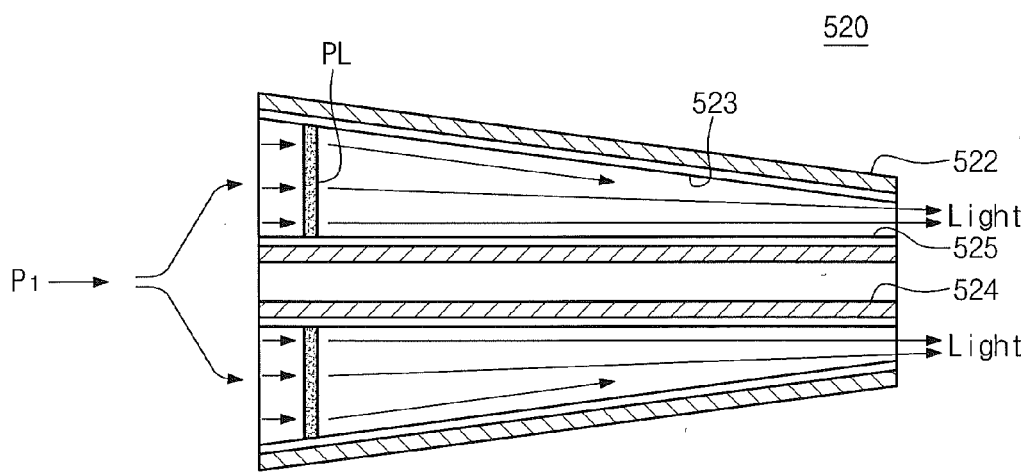
FIGS. 8A and 8B are cross sectional views that illustrate the operation of another example of the plasma unit shown in FIGS. 7A and 7B.
Figure 8B:
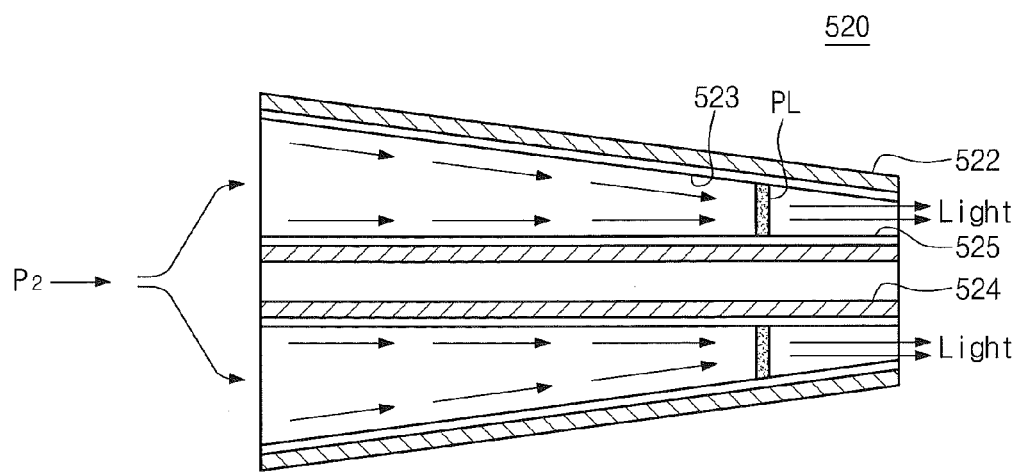

FIGS. 8A and 8B illustrate the operation of a plasma unit according to other embodiments. Referring to FIGS. 8A and 8B, a first electrode 522 may have a shape of cylinder whose hollow portion is tapered such that a sectional area of an inside hollow portion of the first electrode 522 gradually decreases in a length direction (sample gas flow direction). A second electrode 524 may have a shape of rod whose sectional area is constant in a length direction (sample gas flow direction). Accordingly, a distance between the first electrode 522 and the second electrode 524 is constant in a circumferential direction but gradually decreases in a sample gas flow direction. Dielectric substances 523 and 525 are provided on opposite surfaces of the first electrode 522 and the second electrode 524, respectively.

In this case, a plasma generation position varying with a pressure of a sample gas is opposite to that of FIGS. 7A and 7B. In the case that the pressure of a sample gas is a low pressure $P_1$ of high-vacuum, the distance between the electrodes 522 and 524 must be wide to generate plasma PL, as shown in FIG. 8A. Therefore, the plasma PL is generated at a front end portion of a space between the electrodes 522 and 524. Meanwhile, in the case that the pressure of a sample gas is an atmospheric pressure $P_2$, the distance between the electrodes 522 and 524 must be more narrow to generate the plasma PL, as shown in FIG. 8B. Therefore, the plasma Pl is generated at a back end portion of the space between the electrodes 522 and 524. The generated plasma PL has a donut-shaped three-dimensional space distribution, and plasma is generated in such a manner while a plasma generation position varies with a pressure of a sample gas.

Figure 9A:
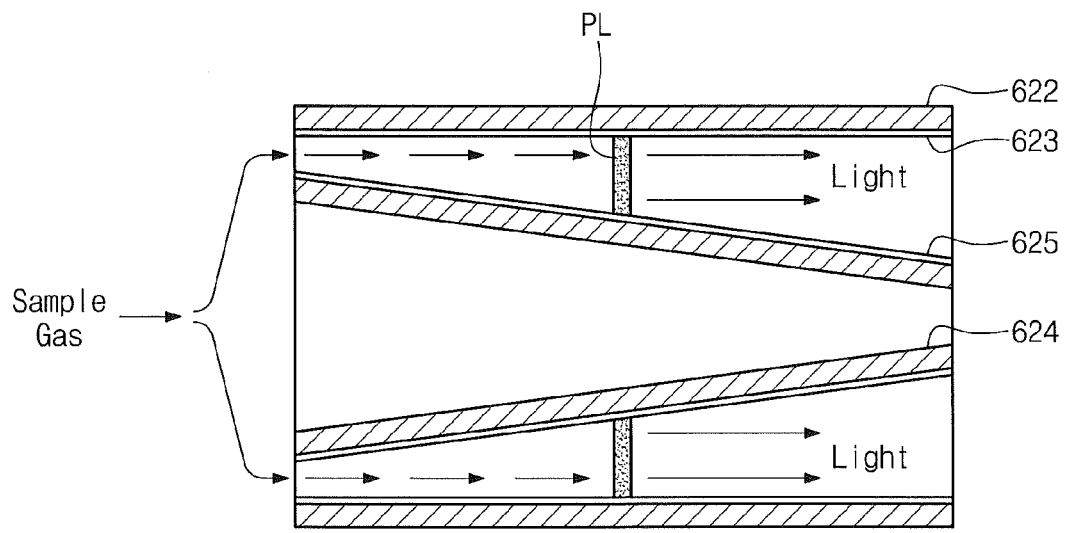
FIG. 9A is a cross sectional view that illustrates the operation of a plasma unit according to another embodiment of the inventive concept.
Figure 9B:
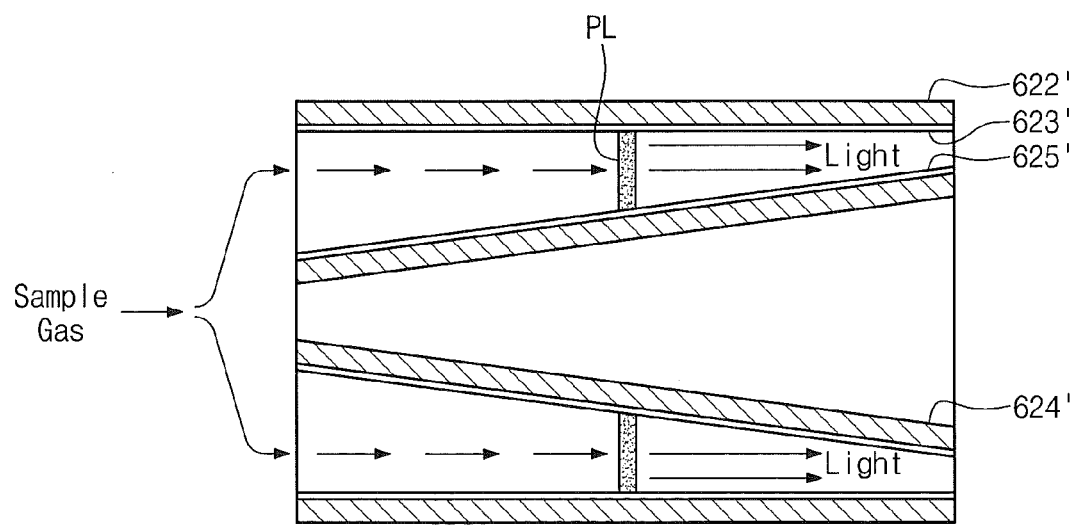
FIG. 9B is a cross sectional view that illustrates the operation of another example of the plasma unit shown in FIG. 9A.

FIG. 9A illustrates the operation of a plasma unit according to yet other embodiments, and FIG. 9B illustrates the operation of other examples of the plasma unit shown in FIG. 9A.

Referring to FIG. 9A, a first electrode 622 may have a shape of cylinder whose sectional area is constant in a length direction (sample gas flow direction). A second electrode 624 may have a shape of rod whose hollow portion is tapered such that a sectional area of an inside hollow portion of the second electrode 624 gradually decreases in a length direction (sample gas flow direction). Accordingly, a distance between the first electrode 622 and the second electrode 624 is constant in a circumferential direction but gradually increases in a sample gas flow direction. Dielectric substances 623 and 625 are provided on opposite surfaces of the first electrode 622 and the second electrode 624, respectively.

Although not illustrated in this figure, in the case that a pressure of a sample gas is a low pressure $P_1$ of high-vacuum, plasma PL is generated at a back end portion of a space between the electrodes 622 and 624. Meanwhile, in the case that the pressure of a sample gas is a atmospheric pressure $P_2$, the plasma PL is generated at a front end portion of the space between the electrodes 622 and 624. The generated plasma PL has a donut-shaped three-dimensional space distribution between the electrodes 622 and 624.

Referring to FIG. 9B, a first electrode 622' may have a shape of cylinder whose inside hollow portion has a constant sectional area in a length direction (sample gas flow direction). A second electrode 624' may have a shape of rod whose hollow portion is tapered such that a sectional area of an inside hollow portion of the second electrode 624' gradually increases in a length direction (sample gas flow direction). Accordingly, a distance between the first electrode 622' and the second electrode 624' is constant in a circumferential direction but gradually decreases in a sample gas flow direction. Dielectric substances 623' and 625' are provided on opposite surfaces of the first electrode 622' and the second electrode 624', respectively.

Although not illustrated in this figure, in the case that a pressure of a sample gas is a low pressure $P_1$ of high-vacuum, plasma PL is generated at a front end portion of a space between the electrodes 622' and 624'. Meanwhile, in the case that the pressure of a sample gas is an atmospheric pressure $P_2$, the plasma PL is generated at a back end portion of the space between the electrodes 622' and 624'. The generated plasma PL has a donut-shaped three-dimensional space distribution between the electrodes 622' and 624'.

Figure 10A:
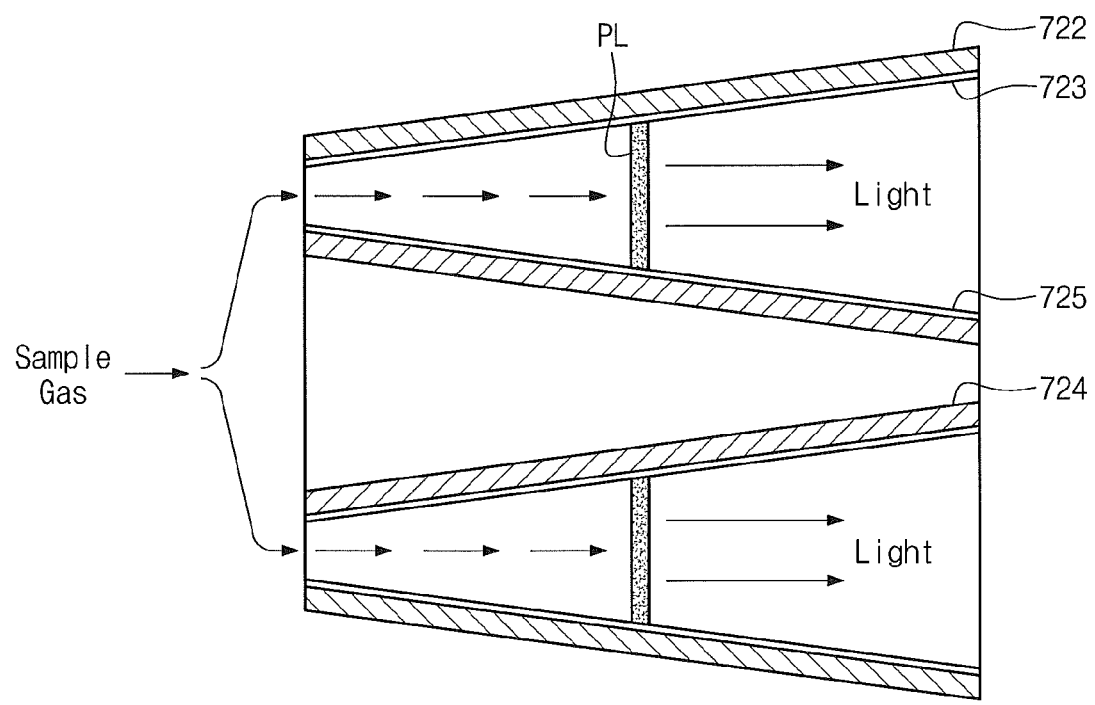
FIG. 10A is a cross sectional view that illustrates the operation of a plasma unit according to another embodiment of the inventive concept.
Figure 10B:
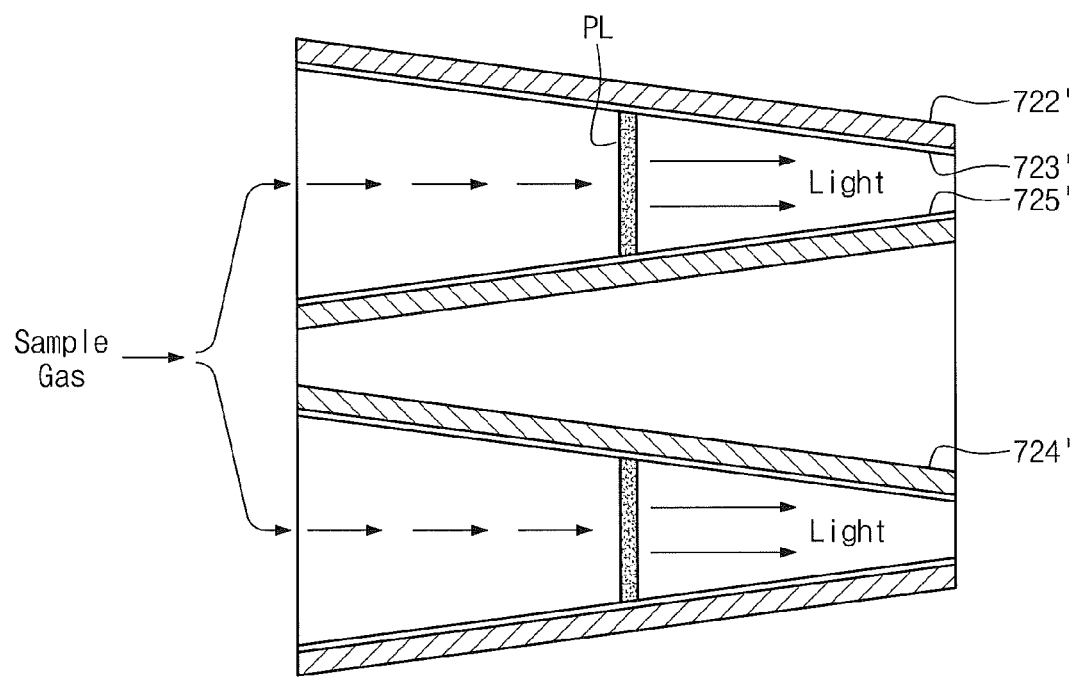
FIG. 10B is a cross sectional view that illustrate the operation of another example of the plasma unit shown in FIG. 10A.

FIG. 10A illustrates the operation of a plasma unit according to other embodiments, and FIG. 10B illustrates the operation of other examples of the plasma unit shown in FIG. 10A.

Referring to FIG. 10A, a first electrode 722 may have a shape of cylinder whose hollow portion is tapered such that a sectional area of an inside hollow portion of the first electrode 722 gradually increases in a length direction (sample gas flow direction. A second electrode 724 may have a shape of rod tapered such that a sectional area of an inside hollow portion of the second electrode 724 gradually decreases in a length direction (sample gas flow direction), in contrast to the first electrode 722. Accordingly, a distance between the first electrode 722 and the second electrode 724 is constant in a circumferential direction but gradually increases in a sample gas flow direction. Dielectric substances 723 and 725 are provided on opposite surfaces of the first electrode 722 and the second electrode 724, respectively.

Although not illustrated in this figure, in the case that a pressure of a sample gas is a low pressure $P_1$ of high-vacuum, plasma PL is generated at a back end portion of a space between the electrodes 722 and 724. Meanwhile, in the case that the pressure of a sample gas is an atmospheric pressure $P_2$, the plasma PL is generated at a front end portion of the space between the electrodes 722 and 724. The generated plasma PL has a donut-shaped three-dimensional space distribution between the electrodes 722 and 724.

Referring to FIG. 10B, A first electrode 722' may have a shape of rod whose hollow portion is tapered such that a sectional area of an inside hollow portion of the first electrode 722' gradually decreases in a length direction (sample gas flow direction). A second electrode 724' may have a shape of rod tapered such that a sectional area of an inside hollow portion of the second electrode 724' gradually increases in a length direction (sample gas flow direction), in contrast to the first electrode 722'. Accordingly, a distance between the first electrode 722' and the second electrode 724' is constant in a circumferential direction but gradually decreases in a sample gas flow direction. Dielectric substances 723' and 725' are provided on opposite surfaces of the first electrode 722' and the second electrode 724', respectively.

Although not illustrated in this figure, in the case that a pressure of a sample gas is a low pressure $P_1$ of high-vacuum, plasma PL is generated at a front end portion of a space between the electrodes 722' and 724'. Meanwhile, in the case that the pressure of a sample gas is an atmospheric pressure $P_2$, the plasma PL is generated at a back end portion of the space between the electrodes 722' and 724'. The generated plasma PL has a donut-shaped three-dimensional space distribution between the electrodes 722' and 724'.

Figure 11A:
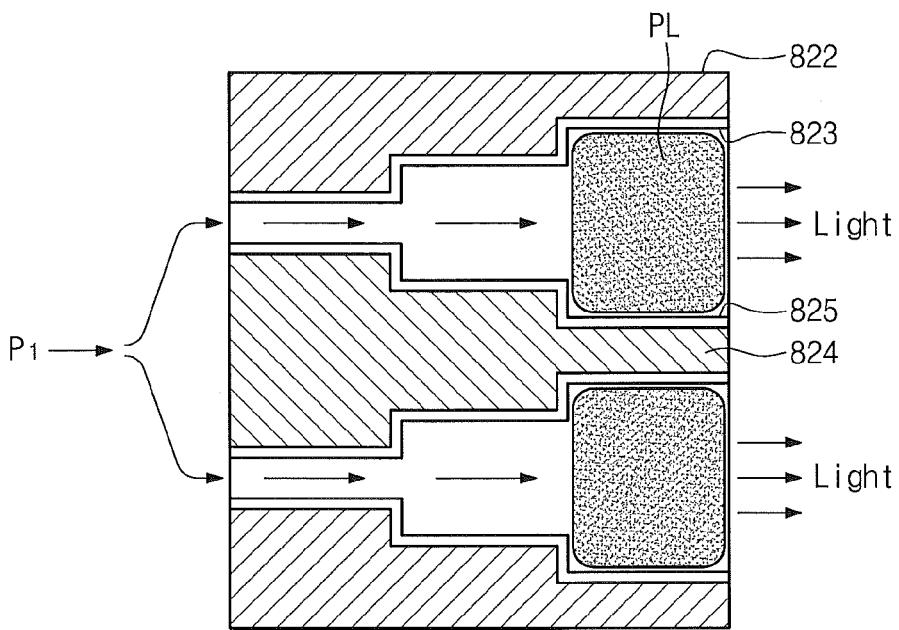
FIGS. 11A to 11C are cross sectional views that illustrate the operation of a plasma unit according to another embodiment of the inventive concept.
Figure 11B:
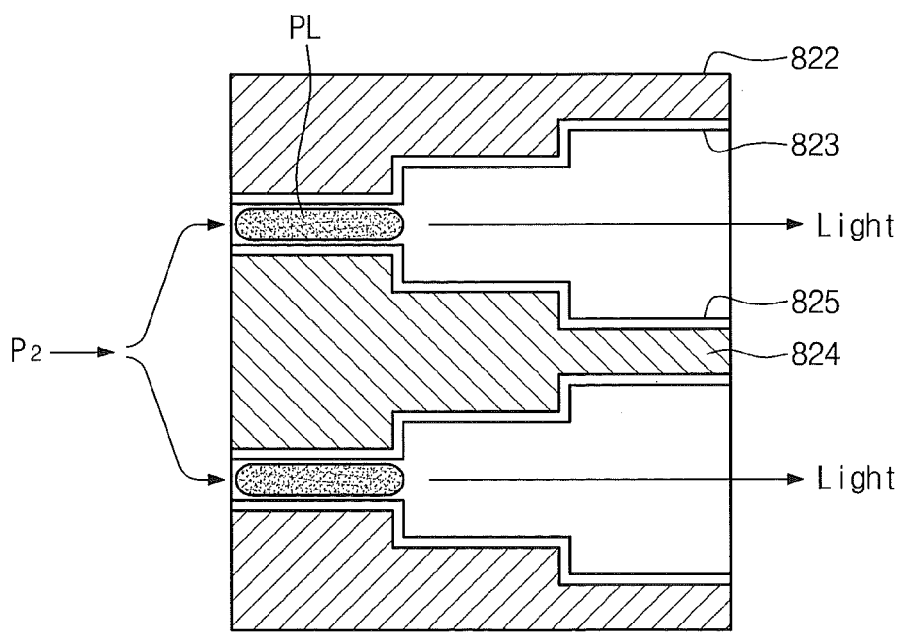
Figure 11C:
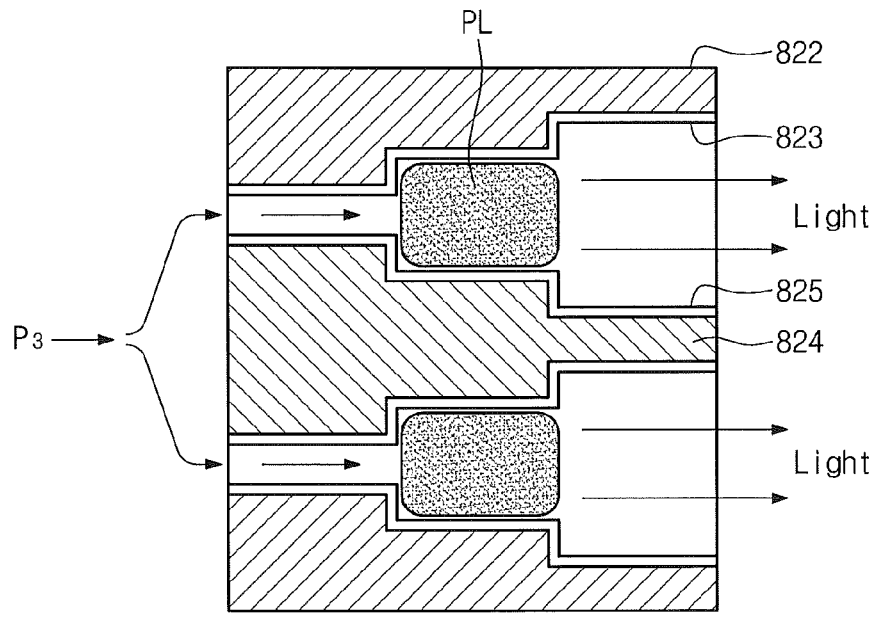
Figure 12A:
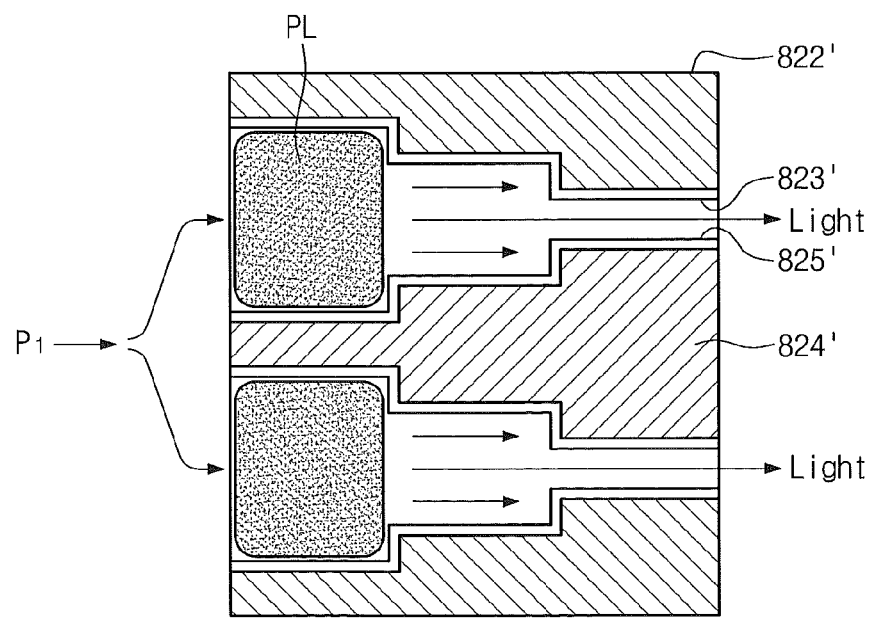
FIGS. 12A to 12C are cross sectional views that illustrate the operation of another example of the plasma unit shown in FIGS. 11A to 11C.
Figure 12B:
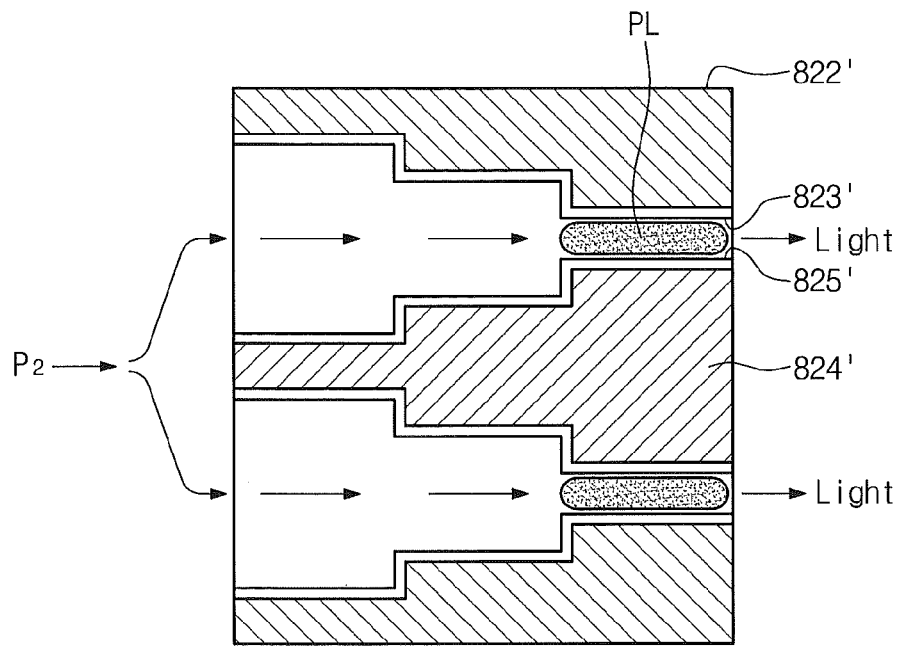
Figure 12C:
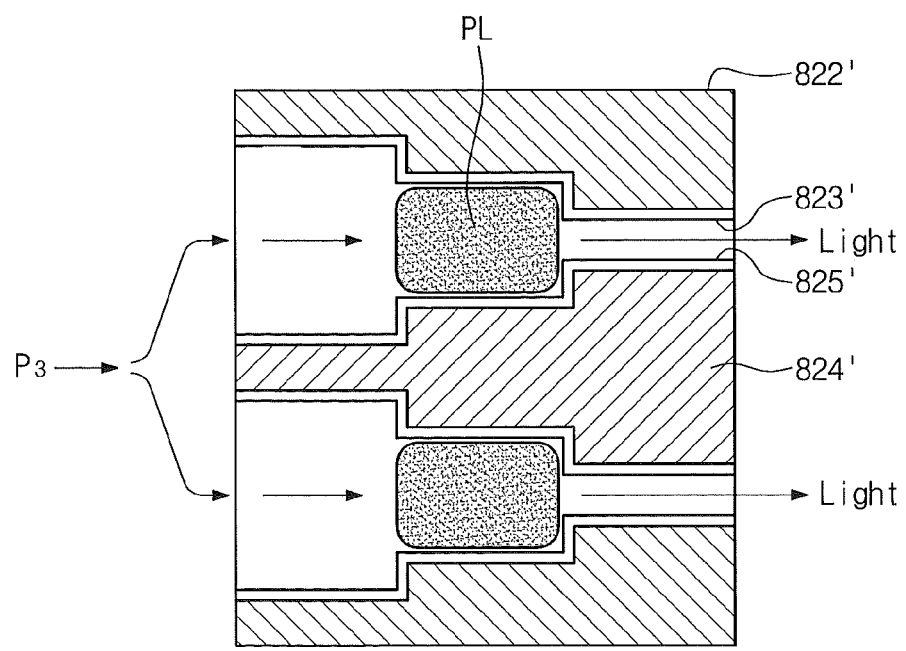

FIGS. 11A to 11C illustrate the operation of a plasma unit according to other embodiments, and FIGS. 12A to 12C illustrate the operation of other examples of the plasma unit shown in FIGS. 11A to 11C.

Referring to FIGS. 11A to 11C, a first electrode 822 may have a shape of cylinder whose hollow portion is stepped such that a sectional area of an inside hollow portion of the first electrode 822 gradually increases in a stepwise manner in a length direction (sample gas flow direction). A second electrode 824 may have a shape of rod stepped such that a sectional area of the second electrode 824 gradually decreases in a stepwise manner in a length direction (sample gas flow direction), in contrast to the first electrode 822. Dielectric substances 823 and 825 are provided on stepped opposite surfaces of the first electrode 822 and the second electrode 824, respectively. Although it is described that the first electrode 822 and the second electrode 824 has three steps, embodiments of the inventive concept are not limited thereto. Rather, the first electrode 822 and the second electrode 824 may have a plurality of steps to cope with pressures of a plurality of sample gases to be monitored.

In the case that the pressure of a sample gas is a low pressure $P_1$ of high-vacuum, the distance between the electrodes 822 and 824 must be wider to generate plasma PL, as shown in FIG. 11A. Therefore, the plasma PL is generated at a back end portion of a space between the electrodes 822 and 824. Meanwhile, in the case that the pressure of a sample gas is an atmospheric pressure $P_2$, the distance between the electrodes 822 and 824 must be narrower to generate the plasma PL, as shown in FIG. 11B. Therefore, the plasma PL is generated at a front end portion of the space between the electrodes 822 and 824. As illustrated in FIG. 11C, in the case that a pressure $P_3$ of a sample gas is a value between the $P_1$ and $P_2$, plasma is generated at the center of the space between the electrodes 822 and 824.

Referring to FIGS. 12A to 12C, a first electrode 822' may have a shape of cylinder whose hollow portion is stepped such that a sectional area of an inside hollow portion of the first electrode 822' gradually decreases in a stepwise manner in a length direction (sample gas flow direction). A second electrode 824' may have a shape of rod stepped such that a sectional area of the second electrode 824' gradually increases in a stepwise manner in a length direction (sample gas flow direction), in contrast to the first electrode 822'. Dielectric substances 823' and 825' are provided on stepped opposite surfaces of the first electrode 822 and the second electrode 824', respectively. Although it is described that the first electrode 822' and the second electrode 824' has three steps, embodiments of the inventive concept are not limited thereto. Rather, the first electrode 822' and the second electrode 824' may have a plurality of steps to cope with pressures of a plurality of sample gases to be monitored.

In the case that the pressure of a sample gas is a low pressure $P_1$ of high-vacuum, the distance between the electrodes 822' and 824' must be wider to generate plasma PL, as shown in FIG. 12A. Therefore, the plasma PL is generated at a front end portion of a space between the electrodes 822' and 824'. Meanwhile, in the case that the pressure of a sample gas is an atmospheric pressure $P_2$, the distance between the electrodes 822' and 824' must be narrower to generate the plasma PL, as shown in FIG. 12B. Therefore, the plasma PL is generated at a back end portion of the space between the electrodes 822' and 824'. As illustrated in FIG. 12C, in the case that a pressure $P_3$ of a sample gas is a value between the $P_1$ and $P_2$, plasma is generated at the center of the space between the electrodes 822' and 824'.

To sum up, a monitoring device according to some embodiments of the inventive concept includes a cylindrical first electrode and a rod-shaped second electrode inserted into the first electrode. A hollow axial plasma generation space is formed between the first and second electrodes, and a sectional area of the plasma generation space gradually increases or decreases in a length direction. Thus, plasma having a donut-shaped three-dimensional space distribution can be generated at a specific axial/lengthwise position corresponding to a pressure of a sample gas. As a result, the intensity of light emitted from the plasma may increase to enhance reliability of process monitoring.

Moreover, the process monitoring device according to some embodiments of the inventive concept can widen an available pressure range to cope with pressures of various sample gases. As a result, the process monitoring device may be able to monitor all the semiconductor manufacturing processes.

According to embodiments of the inventive concept, a section of the hollow portion of the first electrode and a section of the second electrode may be each circular.

According to embodiments of the inventive concept, a section of the hollow portion of the first electrode and a section of the second electrode may be each polygonal.

Embodiments of the inventive concept provide a process monitoring method which may include supplying an exhaust gas in a process chamber to a space between a cylindrical first electrode and a rod-shaped second electrode inserted into the first electrode, wherein the first electrode and the second electrode are coaxially arranged and dielectric substances are coupled with opposite surfaces of the first and second electrodes; applying a power to one of the first and second electrodes to generate plasma; and analyzing a spectroscopic signal of light emitted from the plasma to monitor a state of a process performed in the process chamber. A distance between the first electrode and the second electrode may vary with an inflow direction of the exhaust gas.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims.

Therefore, it is to be understood that the foregoing is illustrative of the present invention and is not to be construed as limited to the specific embodiments disclosed, and that modifications to the disclosed embodiments, as well as other embodiments, are intended to be included within the scope of

What is claimed is:

1. A process monitoring device comprising:
    plasma generating unit comprising;
    a hollow cylindrical first electrode having a length extending in a length direction;
    a second electrode having a length extending in the length direction and positioned within and displaced from the first electrode,
    wherein the first electrode has an inner diameter and the second electrode has an outer diameter selected to vary the distance between the electrodes in the length direction so that the plasma generating unit generates a plasma by ionizing a gas flowing between the electrodes at a different position in the length direction based on a pressure of the gas,
    wherein the inner diameter of the first electrode varies substantially uniformly in the length direction, and
    wherein the outer diameter of the second electrode varies substantially uniformly in the length direction and decreases as the inner diameter of the first electrode increases;
    an optical emission spectroscopy unit positioned proximate the plasma generating unit that is configured to analyze light emitted from the plasma generated by the plasma unit, and
    a power supply coupled to the first and second electrodes configured to power the electrodes to ionize the gas flowing therebetween.

2. The process monitoring device of claim 1, wherein the power supply is configured to supply an alternating voltage to one of the electrodes and to ground the other of the electrodes.

3. The process monitoring device of claim 1, wherein the electrodes have a distance therebetween around substantially an entire circumference of the electrodes and wherein the plasma generating unit is configured to generate the plasma to have a donut-shaped three-dimensional space distribution.

4. The process monitoring device of claim 3, wherein the first and second electrode are coaxially aligned in the length direction and wherein a distance between the electrodes is substantially the same around the entire circumference of the electrodes.

5. The process monitoring device of claim 3, further comprising a housing including an inflow port configured to be coupled to an exhaust line of a process chamber of a semiconductor manufacturing process and a partition dividing the housing into a first area, with the inflow port positioned on a first side of the first area and a window in the partition opposite the inflow port, and a second area, wherein the plasma generating unit is positioned in the first area extending in the length direction from proximate the inflow port to proximate the window and the optical spectroscopy unit is positioned in the second area to detect the light emitted from the plasma.

6. A semiconductor process apparatus, comprising:
    a process chamber configured to execute a semiconductor manufacturing process and having an exhaust line extending therefrom;
    a housing including an inflow port connected to the exhaust line of the process chamber and a partition dividing an inner space thereof into a first area and a second area, wherein the partition includes a window therein between the first and second area;
    a plasma unit positioned in first area of the housing and configured to generate plasma by ionizing an exhaust gas flowing from the process chamber into the housing through the inflow port; and
    an optical emission spectroscopy unit positioned in the second area of the housing and configured to analyze light emitted from the plasma, wherein the plasma unit comprises:
    an open ended hollow cylindrical first electrode extending in a length direction from proximate the inflow port to proximate the window in the partition;
    a second electrode positioned within and displaced from the first electrode with a distance therebetween and extending in the length direction from proximate the inflow port to proximate the window in the partition, wherein the first electrode has an inner diameter and the second electrode has an outer diameter selected to vary the distance between the electrodes in the length direction so that the plasma generating unit generates a plasma by ionizing the exhaust gas flowing between the electrodes at a different position in the length direction based on a pressure of the exhaust gas, wherein the inner diameter of the first electrode varies substantially uniformly in the length direction and the outer diameter of the second electrode varies substantially uniformly in the length direction and decreases as the inner diameter of the first electrode increases; and
    a power supply coupled to the first and second electrodes configured to power the electrodes to ionize the gas flowing therebetween.

7. The semiconductor processing apparatus of claim 6, wherein the electrodes each extend around substantially an entire circumference of the electrodes and wherein the plasma generating unit is configured to generate the plasma to have a donut-shaped three-dimensional space distribution.

* * * * *